United States Patent
Katagiri

(10) Patent No.: US 8,080,968 B2
(45) Date of Patent: Dec. 20, 2011

(54) DRIVE CONTROL DEVICE FOR A STEPPER MOTOR AND DRIVE CONTROL METHOD OF THE STEPPER MOTOR

(75) Inventor: Dai Katagiri, Saitama (JP)

(73) Assignee: Calsonic Kansei Corporation, Saitama (JP)

( * ) Notice: Subject to any disclaimer, the term of this patent is extended or adjusted under 35 U.S.C. 154(b) by 491 days.

(21) Appl. No.: 12/318,101

(22) Filed: Dec. 22, 2008

(65) Prior Publication Data
US 2009/0167232 A1 Jul. 2, 2009

(30) Foreign Application Priority Data
Dec. 27, 2007 (JP) ................. 2007-337278

(51) Int. Cl.
*H02P 8/00* (2006.01)
(52) U.S. Cl. .......... 318/696; 318/400.42; 318/560; 318/671; 318/685; 318/700
(58) Field of Classification Search ........... 318/696, 318/400.42, 700, 685, 671, 560
See application file for complete search history.

(56) References Cited

U.S. PATENT DOCUMENTS

| | | | |
|---|---|---|---|
| 6,956,351 B2 * | 10/2005 | Yamada | 318/685 |
| 7,034,496 B2 * | 4/2006 | Oishi | 318/696 |
| 2005/0083008 A1 * | 4/2005 | Oishi | 318/696 |

FOREIGN PATENT DOCUMENTS

| | | |
|---|---|---|
| JP | 2004-328807 | 11/2004 |
| JP | 2007228763 A * | 9/2007 |

OTHER PUBLICATIONS

Machine translation of JP2007228763A.*

* cited by examiner

*Primary Examiner* — Walter Benson
*Assistant Examiner* — Kawing Chan
(74) *Attorney, Agent, or Firm* — Wenderoth, Lind & Ponack, L.L.P.

(57) ABSTRACT

A stepper motor control device includes a control device that controls an operation of a stepper motor. The control device implements a target rotational angle change computation process that calculates a target rotational angle change of the stepper motor and a divisional target rotational angle computation process that equally divides the target rotational angle change within a range not exceeding a rotational limit for loss of synchronism of the stepper motor. The divisional target rotational angle computation process divides the target rotational angle change within the range to calculate a "quotient" and a "remainder" thereof. The drive control device of the stepper motor sets the "quotient" to "quotient+1" in the case the "remainder" portion is not—and obtains a first divisional target rotational angle and a second divisional target rotational angle differing from the first divisional target rotational angle to drive the stepper motor.

3 Claims, 4 Drawing Sheets

DRIVE CONTROL DEVICE FOR A STEPPER MOTOR AND DRIVE CONTROL METHOD OF THE STEPPER MOTOR

PRIORITY CLAIM

This application claims priority from Japanese Patent Application No. 2007-337278, filed with the Japanese Patent Office on Dec. 27, 2007, the contents of which are incorporated herein by reference in their entirety.

BACKGROUND OF THE INVENTION

1. Field of the Invention

The present invention relates to a drive control technology of a stepper motor used to drive the indicator needle of an indicator needle type analog meter or the like, and relates especially to a technology that prevents loss of synchronism.

2. Description of the Related Art

Conventionally, an analog type meter apparatus that rotates an indicator needle by a stepper motor is widely known as a vehicle speed meter or the like. This meter apparatus includes a stepper motor control device. The stepper motor control device includes a sensor that detects physical quantities (vehicle speed) and a control device that calculates an indicating angle of the indicator needle based on inputs, that is, data corresponding to the physical quantities (vehicle speed) sent from a sensor and outputs the indicating angle. The control device implements a target rotational angle computation process that calculates a target rotational angle based on data corresponding to the physical quantities (vehicle speed) sent from the sensor, that is, a rotational angle of a drive shaft of the stepper motor necessary for obtaining the indicating angle, a target rotational angle change computation process that calculates a target rotational angle change which is a difference between a present rotational angle of the drive shaft of the stepper motor and the target rotational angle, and a divisional target rotational angle computation process that equally divides the target rotational angle change by a first divisional target rotational angle within a range not exceeding a rotational limit for loss of synchronism of the stepper motor. The control device is a drive control device of the stepper motor that drives the stepper motor by supplying to the stepper motor a second divisional target rotational angle which is a value calculated by the divisional target rotational angle computation process as a rotational angle per one control period.

Loss of synchronism, that is, misalignment generated between the actual indicating angle of the indicator needle and an indicating angle controlled by the drive control device for a stepper motor is problematic in a drive control device for a stepper motor as such.

One of the reasons for this loss of synchronism is that in the case if rotational angle changes of a drive shaft are too large, influences due to the inertial force of the drive shaft become large so that there are cases in which synchronization is difficult because of the differences generated between the drive shaft and the indicating angle.

A drive control device for a stepper motor described in, for example, JP2004-328807A is known to prevent loss of synchronism in such cases of excessive rotational angle.

This conventional drive control device for a stepper motor sets a limit value to a rotational angle of the drive shaft in a single control period and prevents an angle rotation surpassing the limit value during a single control period. Thereby loss of synchronism due to the above described excessive rotational angle changes of the drive shaft is prevented.

SUMMARY OF THE INVENTION

However, in the above described conventional technology, in the case the target rotational angle of the drive shaft greatly surpasses the limit value, the problems described hereinbelow occur.

FIG. 6 illustrates the cases in which 0°, 10°, 5° and 40° are respectively provided as the indicating angles of the indicator needle in control periods SS1, SS2, SS3 and SS4.

In this example, for example, if the limit value is 10°, the rotational angle changes necessary in the control period SS4 where the indicating angle of the indicator angle changes from 5° to 40° is 35° so that the limit value is surpassed. In this case, according to data outputted, the indicator needle is rotated for 10°, that is, the limit value in control periods SS4, SS5 and SS6. Thereafter, data is outputted to rotate the indicator needle for the difference, that is, the remaining 5° in the last control period SS7.

As described above, in the conventional technology, in the case the indicator needle has to be rotated exceeding the limit value, the indicator needle is rotated first by the limit value, then by the remaining difference. Therefore, the rotational angle changes of the drive shaft are not constant and the rotation of the indicator needle is not smooth.

Besides, normally, the limit value is set, in consideration of responsiveness, to an upper limit of a value that does not generate loss of synchronism. In the case the necessary rotational angle changes are larger than the limit value, rotations are always repeated at the limit value so that in comparison to drives smaller than the limit value, the rotations are not preferable from the viewpoint to prevent loss of synchronism.

The present invention has been made in view of the above conventional problems. An object of the present invention is to provide a drive control device for a stepper motor and a drive control method of the stepper motor that always rotates a drive shaft at a constant angle change, enables the smooth rotation of the drive shaft and reduces output chances to reach the limit value so that performances to prevent loss of synchronization can be improved.

To accomplish the above object, a stepper motor control device and a drive control method of a stepper motor according to the present invention includes a sensor that detects physical quantities (vehicle speed) and a control device that operates a stepper motor based on data corresponding to the physical quantities (vehicle speed) sent from the sensor. The control device implements a target rotational angle computation process that calculates a target rotational angle of a drive shaft of the stepper motor based on data corresponding to the physical quantities (vehicle speed) sent from the sensor, a target rotational angle change computation process that calculates a target rotational angle change which is a difference between a present rotational angle of the drive shaft of the stepper motor and the target rotational angle, and a divisional target rotational angle computation process that equally divides the target rotational angle change by a first divisional target rotational angle within a range not exceeding a rotational limit for loss of synchronism of the stepper motor. The control device is a drive control device of the stepper motor that drives the stepper motor by supplying to the stepper motor a second divisional target rotational angle which is a value calculated by the divisional target rotational angle computation process as a rotational angle per one control period.

DETAILED DESCRIPTION OF THE INVENTION

An embodiment of the present invention will be described hereinbelow with reference to the accompanying drawings.

A stepper motor control device of the present embodiment includes a sensor that detects physical quantities (vehicle speed) and a control device that operates a stepper motor based on data corresponding to the physical quantities (vehicle speed) sent from the sensor. The control device implements a target rotational angle computation process that calculates a target rotational angle of a drive shaft of the stepper motor based on data corresponding to the physical quantities (vehicle speed) sent from the sensor, a target rotational angle change computation process that calculates a target rotational angle change which is a difference between a present rotational angle of the drive shaft of the stepper motor and the target rotational angle and a divisional target rotational angle computation process that equally divides the target rotational angle change by a first divisional target rotational angle within a range not exceeding a rotational limit for loss of synchronism of the stepper motor. The control device is a drive control device of the stepper motor that drives the stepper motor by supplying to the stepper motor a second divisional target rotational angle which is a value calculated by the divisional target rotational angle computation process as a rotational angle per one control period.

Embodiment 1

A drive control device for a stepper motor A according to a first embodiment of the present invention is described hereinbelow.

Figure 1:
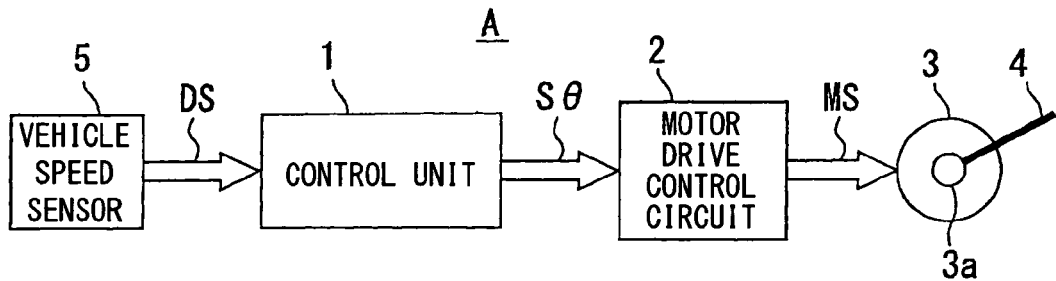
FIG. 1 is a constitutional explanatory diagram that illustrates a constitution of a drive control device for a stepper motor according to a first embodiment, that is, a best embodiment of the present invention.

The drive control device for a stepper motor A of the first embodiment, as illustrated in FIG. 1, includes a control unit (control device) 1, a motor drive control circuit (control device) 2 and a stepper motor 3.

The stepper motor 3 is used for a vehicle speed display apparatus abbreviated hereby for illustration. That is to say, the vehicle speed display apparatus is a well-known analog type display apparatus that displays speed by setting an indicator needle 4 to rotate along a scale engraved on a dial (abbreviated for illustration) accompanying the rotation of a drive shaft 3a driven by the stepper motor 3.

Vehicle speed data DS outputted from the vehicle speed sensor 5 is inputted to the control unit (control device) 1 by set periods (10 ms in embodiment 1). Based on the vehicle speed data DS, the control unit (control device) 1 implements a target rotational angle computation process (indicating angle computation process, target rotational angle computation step) that calculates a target rotational angle (target indicating angle) DA of the indicator needle 4 and an indicating angle signals output process that outputs to the motor drive control circuit (control device) 2 indicating angle signals Sθ illustrating the target rotational angle (target indicating angle) DA.

The indicating angle signals Sθ are outputted with pre-set sending periods. In the first embodiment, the indicating angle signals Sθ are outputted with 10 ms periods.

In addition, the indicating angle signals Sθ are inputted to the motor drive control circuit (control device) 2. The motor drive control circuit (control device) 2 implements a target rotational angle change computation process that calculates a target rotational angle change RR, that is, the difference between the target rotational angle (target indicating angle) DA and a present rotational angle Dx of the drive shaft 3a (an indicating command angle Dx of the last time due to data transmission delay). The motor drive control circuit (control device) 2 also implements a divisional target rotational angle computation process that equally divides the target rotational angle change (RR) by a first divisional target rotational angle (Rθ) within a range not exceeding a rotational limit for loss of synchronism of the stepper motor (in the range, rotational angle changes within each one control period (SS) are values below a limitation value SA and only minimum control periods are necessary) and calculates a second divisional target rotational angle, that is, a rotational angle per one control period. Drive signals MS that rotate the drive shaft 3a are outputted based on the second divisional target rotational angle. The first divisional target rotational angle (Rθ) is an amount of divisional target rotational angle which is equally divided within a range that does not exceed a rotational limit (limitation value SA) for loss of synchronism of the stepper motor.

Figure 2:
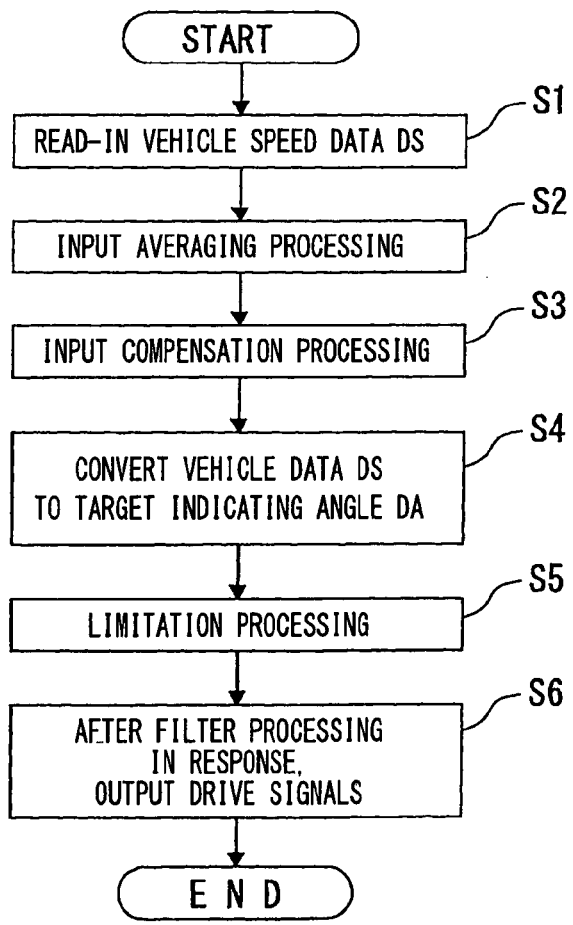
FIG. 2 is a flowchart that illustrates the process flows in a control unit and a motor drive control circuit of the drive control device for a stepper motor of the first embodiment.

FIG. 2 illustrates the process flows in the control unit (control device) 1 and the motor drive control circuit (control device) 2 described above. In the first embodiment, process illustrated in the flow chart of FIG. 2 is repeatedly implemented with 10 ms as the control period SS.

In step S1, the vehicle speed data DS is read-in. Furthermore, in the next step S2, data is subjected to an averaging process. Thereafter, in step S3, a compensation process is performed. The above-described averaging process and compensation process are general data processes that do not constitute the executive summary of the present invention, and thus the detailed descriptions of these processes are abbreviated.

In the next step S4, the vehicle speed data DS is converted to the target rotational angle (target indicating angle) DA of the indicator needle 4. That is, a process (the target rotational angle computation process) is implemented to convert the speed to be indicated by the indicator needle 4 to a rotational angle from the initial position where the speed indicated by the indicator needle 4 is 0 km/h.

Next, in step S5, a limitation process is implemented.

The limitation process is a process that limits the rotational angle changes in a single control period SS to a value within a pre-set limitation value SA. The limitation value SA does not exceed the upper limit value of angle changes with no risk of loss of synchronism when the indicator needle 4, that is, the drive shaft 3a is rotated towards the target indicating angle DA.

In the first embodiment, 10° is used as the limitation value SA. But the limitation value SA can use any appropriate value based on experiment or the like. In the first embodiment, the limitation value SA is the first divisional target rotational angle (Rθ).

In the next step S6, the target rotational angle (target indicating angle) DA is applied to a filter process. Thereafter, the drive signals MS that rotate the drive shaft 3a to the target rotational angle (target indicating angle) DA are outputted.

In addition, in the first embodiment, the drive signals MS are outputted for every pre-set drive unit period in pre-set control periods SS. In the first embodiment, 1 ms is used as the drive unit period so that in the control period SS of 10 ms, drive signals MS are outputted 10 times.

Figure 3:
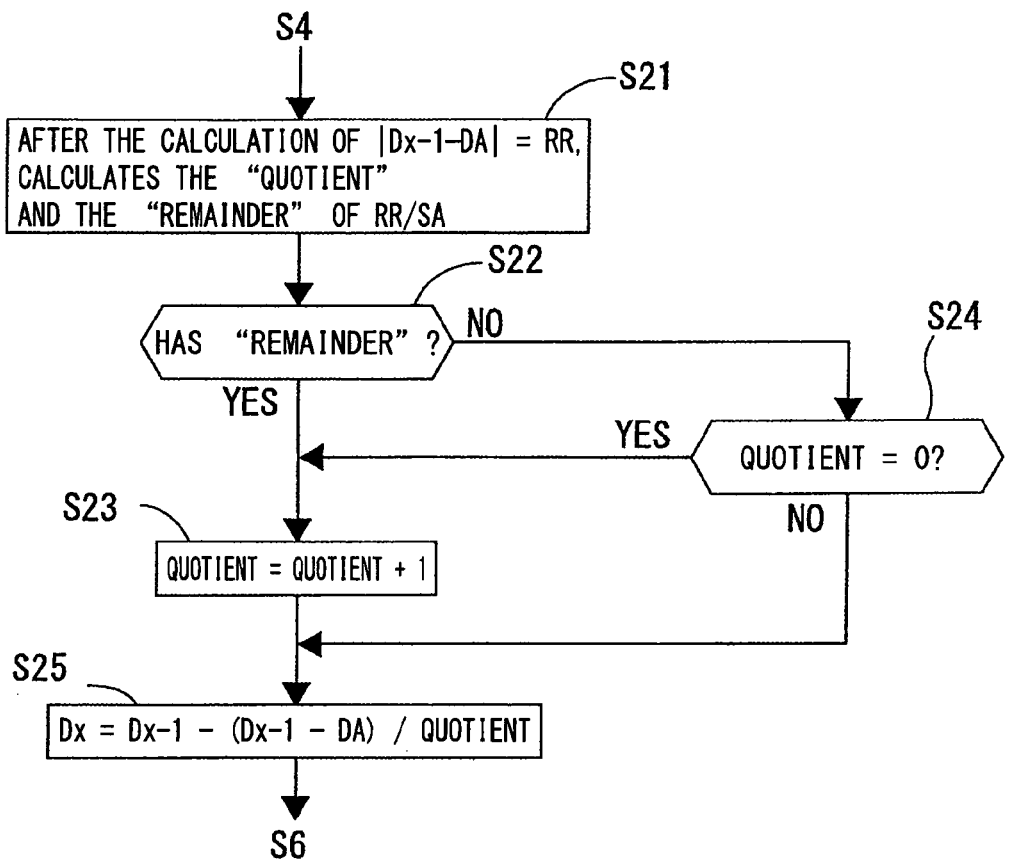
FIG. 3 is a flowchart that illustrates the details of a limitation process of stepper illustrated in FIG. 2.

Next, the details of the limitation process of step S5 are described using the flowchart of FIG. 3.

The limitation process first implements the divisional target rotational angle computation process in step S21. The divisional target rotational angle computation process is a process that calculates a "quotient" and a "remainder" in the case the target rotational angle change RR, which is the rotational angle necessary for the indicator needle 4 to indicate the target indicating angle DA, is divided by the first divisional target rotational angle (Rθ).

Specifically, a process (target rotational angle change computation process) is implemented to calculate the target rotational angle change RR, that is, the difference between the target rotational angle (target indicating angle) DA and an indicating command angle $D_{x-1}$ of the last time as the present rotational angle (present indicating angle) of the indicator needle 4 by the formula RR=|$D_{x-1}$−DA|. Furthermore, a divisional target rotational angle computation process (division process) is implemented to equally divide the target rotational angle change RR by the first divisional target rotational angle within a range not exceeding a rotational limit (the limitation value SA) for loss of synchronism of the stepper motor. The "quotient" and the "remainder" thereof are calculated.

In the next step S22, whether there is a "remainder" to the computation results of step S21 or not is determined. In the case the "remainder" exists, the process then proceeds to step S23. In step S23, a process that sets a new "quotient" value yielded by adding "1" to the "quotient" of the computation results of step S21 is performed to obtain a second divisional target rotational angle differing from the first divisional target rotational angle. The stepper motor is then driven based on the second divisional target rotational angle. The second divisional target rotational angle is a maximum value within a range in which the stepper motor does not lose synchronism.

On the other hand, in the case the "remainder" does not exist, the process then proceeds to step S24 and whether the "quotient" is 0 or not is determined. In the case the "quotient"=0, the process then proceeds to step S23. In the case the "quotient" is not 0, the process then proceeds to step S25.

In the step S25, a process that equally divides the indicating command angle Dx of the drive shaft 3a in the control period SS of this time is performed by the following formula (1).

$$Dx=D_{x-1}-(D_{x-1}-DA)/\text{quotient} \quad (1)$$

That is, equal division is performed by allocating and adjusting uniformly the "remainder" to each control period SS. Put in another way, allocated quantities to the first divisional target rotational angle are uniform.

Therefore, hereby the second divisional target rotational angle (=($D_{x-1}$−DA)/quotient) of the drive shaft 3a in a single control period SS is set to values below the limitation value SA.

Next, operations of the first embodiment are described.

During operation, the vehicle speed data DS is inputted to the control unit 1 by set periods (10 ms).

The control unit 1 then reads-in the vehicle speed data DS (step S1). Based on the vehicle speed data DS, the target rotational angle (target indicating angle) DA of the indicator needle 4 is calculated (steps S2→S3→S4). Furthermore, the limitation process is implemented based on the target rotational angle (target indicating angle) DA so that the indicating command angle Dx with a value below the limitation value SA is calculated (step S5).

Thereafter the motor drive control circuit 2 outputs in correspondence to the indicating command angle Dx drive signals that can rotate the drive shaft 3a for one tenth of the divisional target rotational angle amount Rθ by a single output, that is, drive signals MS that can reach the indicating command angle Dx by 10 outputs.

Figure 4:
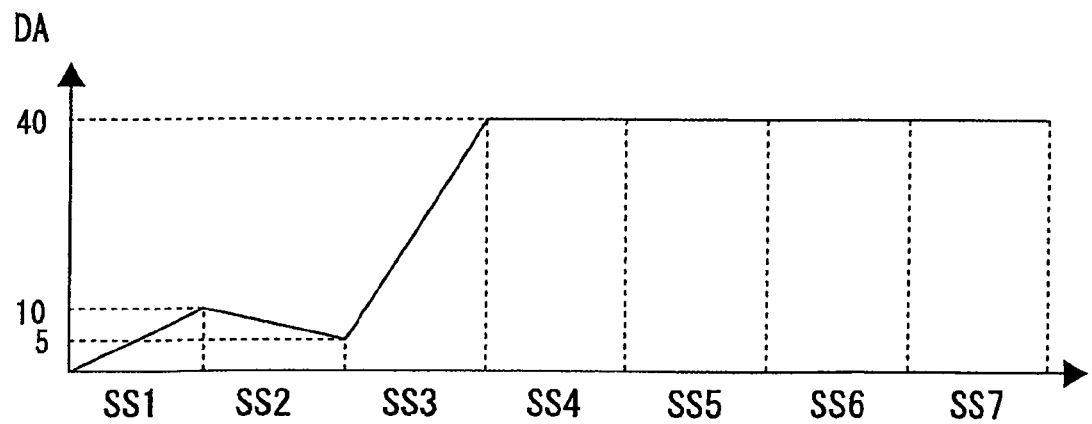
FIG. 4 is a time chart that illustrates an operative example of the drive control device for a stepper motor of the first embodiment, especially, an example of the changes of a target indicating angle.
Figure 5:
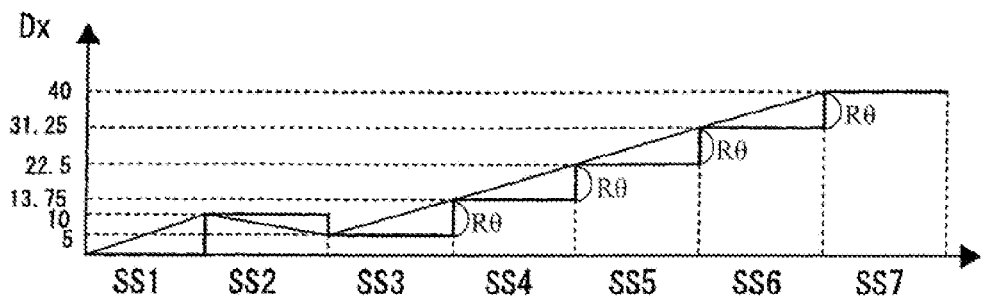
FIG. 5 is a time chart that illustrates an operative example of the drive control device for a stepper motor of the first embodiment, especially, an example of the changes of an indicating command angle.

Operations at the time are described with reference to FIG. 4 and FIG. 5. In this operational example, FIG. 4 illustrates an example in which the target indicating angle DA calculated from vehicle speed data DS shifts in the sequence of 0°→10°→5°→40° in each of control periods SS1 through SS7.

In this case, in control periods SS1 through SS3 illustrated in FIG. 5, the target rotational angle change RR, that is, the difference between the target rotational angle (target indicating angle) DA and the indicating command angle $D_{x-1}$ of the last time ($D_{x-1}$ is the present rotational angle of the drive shaft 3a due to data transmission delay) is a value below the limitation value SA so that the "quotient" calculated in step S21 becomes 0 and in the calculation of step S25, the "quotient"=1.

Therefore, the indicating command angle Dx=DA. In the control period SS1, the indicating command angle Dx=0°. In the control period SS2, the indicating command angle Dx=10°. In the control period SS3, the indicating command angle Dx=5°.

Therefore, in the control period SS1, drive signals MS that shift the indicating angle of the indicator needle 4 from 0° to 10° are outputted. That is, drive signals MS that rotate the drive shaft 3a +1° each time are outputted 10 times. Hereinafter + is a rotation in the clock-wise direction, − is a rotation in the counter clock-wise direction.

In addition, in the next control period SS2, drive signals that shift back the indicating angle of the indicator needle 4 from 10° to 5° are outputted. That is, drives signals that rotate the drive shaft 3a −0.5° each time are outputted 10 times.

Next, in FIG. 4, the case is described in which the target indicating angle DA=40° is consecutively inputted across control periods SS4 through SS7.

In this case, the target rotational angle change RR calculated by the divisional target rotational angle computation process of step S21 becomes 35°, that is, a value larger than the limitation value SA. Then the target rotational angle RR is divided by the first divisional target rotational angle (and the results of the "quotient"=3, the "remainder"=5 are obtained.

Hereby based on the process of step S22→S23, the "quotient"=4 is obtained.

Therefore, in step S25, the above formula (1) is substituted by each value and 5−(5−40)/4 is calculated to obtain the indicating command angle Dx=13.75.

Therefore, in the control period SS4, the indicating angle of the indicator needle 4 needs to be shifted from 5° to 13.75° so that drive signals setting the second divisional target rotational angle (rotational angle per control period) to +8.75° (smaller than the limitation value SA) are outputted. That is, drive signals MS that rotate the drive shaft 3a +8.75°/10 each time are outputted 10 times.

By the same process, in the next control period SS5, from |13.75−40|/the first divisional target rotational angle, the "quotient"=2 and the "remainder"=6.25. The indicating command angle Dx then =22.5 from 13.75−(13.75−40)/3.

Therefore, in the control period SS5, the indicating angle of the indicator needle 4 needs to be shifted from 13.75° to 22.5° so that drive signals setting the second divisional target rotational angle to +8.75° (smaller than the limitation value SA) are outputted. That is, drive signals MS that rotate the drive shaft 3a +8.75°/10 each time are outputted 10 times.

Also based on the same process in the control periods SS6 and SS7, drive signals setting the second divisional target rotational angle (rotational angle of the drive shaft 3a per control period) to +8.75° (smaller than the limitation value SA) are outputted.

Therefore, the indicator needle 4 rotates by the second divisional target rotational angle at a constant angle change towards the target rotational angle (target indicating angle) 40°. The second divisional target rotational angle is an angle change smaller than the limitation value SA.

As described above, in the first embodiment, in the case the rotational angle (target rotational angle change RR) necessary to rotate the indicator needle 4 towards the target rotational angle (target indicating angle) DA exceeds the limitation value SA, the indicator needle 4, that is, the drive shaft 3a can possibly rotate towards the target rotational angle (target indicating angle) DA at a constant angle change due to the first divisional target rotational angle Rθ that has been equally divided within a range that does not exceed the rotational limit (limitation value SA) for loss of synchronism of the stepper motor. Therefore, it is possible for the indicator needle 4 to rotate smoothly.

Besides, when the necessary rotational angle of the drive shaft 3a is divided by the first divisional target rotational angle Rθ, in the case "remainder" is generated, the second divisional target rotational angle (rotational angle of the drive shaft 3a per control period SS) is a value smaller than the limitation value SA so that the drive shaft 3a rotates at the limitation value SA only when "remainder" is not generated. Therefore, in comparison to conventional technologies that always rotate at the limitation value SA, output chances that reach the limitation value SA are reduced and performance to prevent loss of synchronism can be improved.

Figure 6:
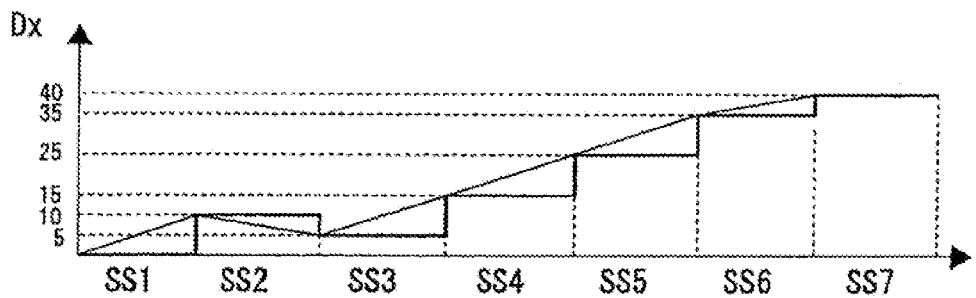
FIG. 6 is a time chart that illustrates a comparison example with the first embodiment, especially, changes of the indicating command angle based on conventional technologies.

In addition, in comparison to a comparison example described in conventional technologies and illustrated in FIG. 6, the same number of control periods SS are necessary to reach the target rotational angle (target indicating angle) DA so that the same control responsiveness as conventional technologies can be secured.

Embodiment 2

Next, a drive control device for a stepper motor according to a second embodiment of the present invention is described hereinbelow. The second embodiment is a modified example of the first embodiment, so that only the differences involved are described. Descriptions of the same constitutions, operations and effects as the first embodiment are abbreviated.

In the second embodiment, process contents of the limitation process implemented in step S5 differ from the first embodiment.

Figure 7:
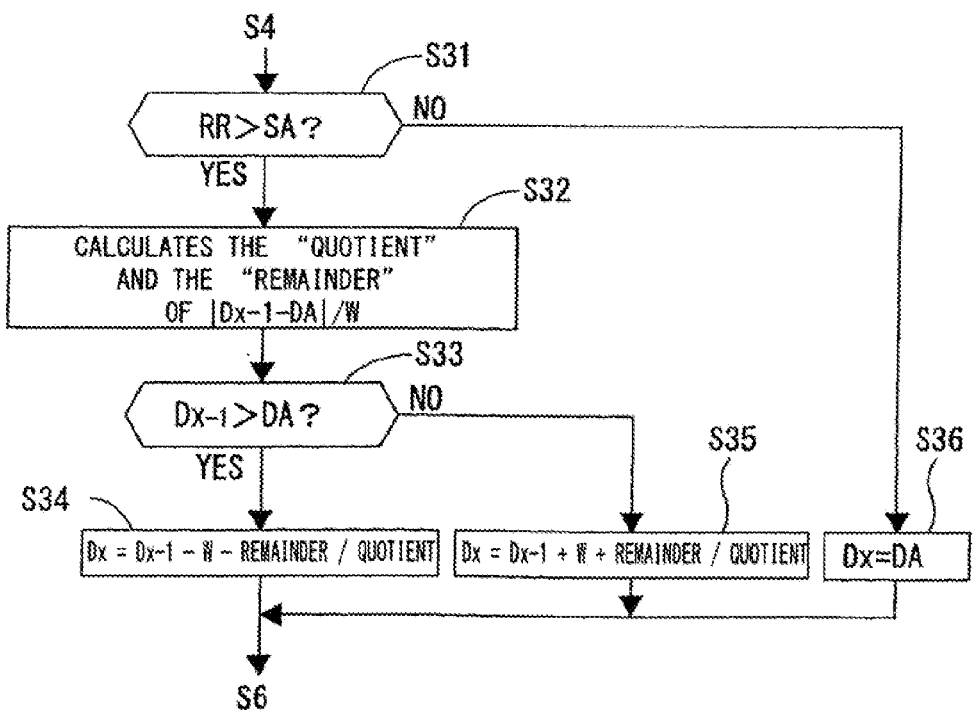
FIG. 7 is a flow chart that illustrates the details of a limitation process in a drive control device for a stepper motor of the second embodiment.

FIG. 7 illustrates the process flows of the limitation process of the second embodiment. In step S31, whether the target rotational angle change RR (=|$D_{x-1}$−DA|) is above the limitation value SA or not is determined. In the case the target rotational angle change RR is equal to or above the limitation value SA, the process proceeds to step S32. In the case the target rotational angle change RR is below the limitation value SA, the process proceeds to step S36 where a process that sets the indicating command angle Dx to equal the target indicating angle DA is implemented.

On the other hand, in the case the target rotational angle change RR is equal to or above the limitation value SA, the process proceeds to step S32 where the divisional target rotational angle computation process that calculates the "quotient" and the "remainder" using the following formula (2) is implemented.

$$|D_{x-1}-DA|/W \tag{2}$$

Hereby, W is a set value for divisional use and is a value smaller than the limitation value SA illustrated in the first embodiment. In the second embodiment, W has approximately 80% of an upper limit value that does not generate loss of synchronism, specifically, W=8°. In the second embodiment, W is the first divisional target rotational angle (Rθ).

Then in step S33, whether the indicating command angle $D_{x-1}$ of the last time (the present rotational angle) is larger than the target rotational angle (target indicating angle) DA or not is determined so that whether rotation is directed to an increased side of the rotational angle or to a decreased side of the rotational angle can be determined. In the case rotation to the decreased side is implemented and $D_{x-1}$>DA, the process proceeds to step S34 and the indicating command angle Dx is calculated by the following formula (3). In the case the rotational angle is on the increased side and $D_{x-1}$≦DA, the process proceeds to step S35 and the indicating command angle Dx is calculated by the following formula (4).

$$Dx=D_{x-1}-W-\text{"remainder"}/\text{"quotient"} \tag{3}$$

$$Dx=D_{x-1}+W+\text{"remainder"}/\text{"quotient"} \tag{4}$$

Next, operations of the second embodiment are described with reference to FIG. 8.

Figure 8:
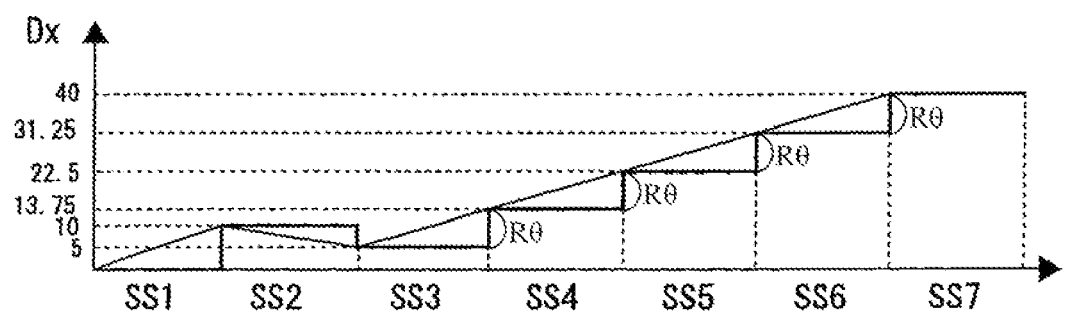
FIG. 8 is a time chart that illustrates an operative example of the drive control device for a stepper motor of the second embodiment, especially, an example of the changes of an indicating command angle.

The example illustrated in FIG. 8 also describes in the same way to the first embodiment the case in which the target rotational angle (target indicating angle) DA shifts in the sequence of 0°→10°→5°→40°.

In this case, first, in the case the target indicating angle DA=10° is inputted, the process proceeds in the sequence of step S31→S36. In the control period SS2, the target indicating angle DA, that is, the limitation value SA=10° is provided as the indicating command angle Dx and drive signals that rotate the drive shaft 3a 10° in a single control period are outputted.

Next, in the control period SS3, even in the case 5° is inputted as the target rotational angle, by the process of step S31→S36, the target rotational angle DA is used directly as the indicating command angle Dx.

Next, in the control period SS4, in the case 40° is inputted as the target rotational angle, the RR exceeds the limitation value SA and the process of step S31→S32→S33 is implemented. In the step S33, the indicating angle is on the increased side so that based on the process of step S35, calculations of the indicating command angle Dx are performed using the above formula (4).

In this case, $D_{x-1}=5$, W=8. In addition, calculations of step S32, that is, calculations of |5−40|/8 yields "remainder"=3, "quotient"=4 so that the indicating command angle Dx=5+ 8+3/4=5+8.75=13.75. Therefore, drive signals MS that set the indicating angle of the indicator needle 4 to 13.75° are outputted.

Furthermore, in the next control period SS5, $D_{x-1}=13.75$ so that |13.75−40|/8 yields "remainder"=2.25, "quotient"=3. Therefore, the indicating command angle Dx=13.75+8+2.25/ 3=13.75+8.75=22.5.

In the same way, in the next control period SS6, Dx=22.5+ 8+1.5/2=22.5+8.75=31.25. Furthermore, in the next control period SS7, Dx=40.

Therefore, in the control period SS4 through SS7, the second divisional target rotational angle=8.75 and drive signals that rotate the drive shaft 3a 0.875° each time are outputted.

As described above, in the second embodiment also, in the case the target rotational angle change RR till the target rotational angle (target indicating angle) DA is reached exceeds the limitation value SA, the indicator needle 4, that is, the drive shaft 3a can possibly rotate at a constant angle change due to the divisional target rotational angle computation process. The divisional target rotational angle computation process equally divides the target rotational angle change RR by the first divisional target rotational angle Rθ. The first divisional target rotational angle Rθ is within a range that does not exceed the rotational limit (limitation value SA) for loss of synchronism of the stepper motor. Therefore, it is possible for the indicator needle 4 to rotate smoothly.

Besides, in the case the target rotational angle change RR of the drive shaft 3a exceeds the limitation value SA, divisional calculations are implemented using a set value, W, for divisional use and smaller than the limitation value SA. In the divisional calculations, the "remainder" is divided by the "quotient" to obtain a value. The value is then added to the set value W for divisional use. Therefore, chances that drive the indicator needle 4, that is, the drive shaft 3a by the rotational angle change at the limitation value SA can be reduced and performances to prevent loss of synchronism can be improved.

In addition, in comparison to a comparison example described in conventional technologies and illustrated in FIG. 6, the same number of control periods SS are necessary to reach the target indicating angle DA so that the same control responsiveness as conventional technologies can be secured.

The first embodiment and the second embodiment of the present invention are described in detail above with reference to the drawings. But the specific constitutions of the present invention are not limited to the first embodiment or the second embodiment. Design modifications to an extent that does not deviate from the scope of the present invention can be included in the present invention.

For example, in the first embodiment and the second embodiment, an example is illustrated in which a stepper motor that rotates an indicator needle of a vehicle speed display apparatus is adapted with a drive control device of a stepper motor. However, the drive control device of a stepper motor can be used for a display apparatus other than the speed display apparatus and apparatuses other than the display apparatus if the apparatuses drive the stepper motor in correspondence to signals inputted from a sensor.

In addition, in the first embodiment and the second embodiment, 10 ms is illustrated as the control period SS and 1 ms is illustrated as the unit drive period but these time can be randomly set based on the properties of the control device.

In addition, in the first embodiment and the second embodiment, a limitation value SA of 10° is illustrated as the value of a range that does not exceed the rotation limit for loss of synchronism. However, the point is that this limitation value is not limited to 10° as long as the rotational angle changes do not generate loss of synchronism (within a range that does not exceed the rotation limit for loss of synchronism).

In addition, in the second embodiment, "8" is illustrated as the set value W for divisional use. But it is not limited to such and other values can be used as long as the values can set the divisional target rotational angle amount RO to below the limitation value.

A drive control device of a stepper motor according to the present invention, in the case the drive shaft is rotated from the present rotational angle to the target rotational angle, calculates target rotational angle change (target rotational angle change computation process), that is, the difference between both angles. The drive control device of the stepper motor then implements a divisional target rotational angle computation process that equally divides the target rotational angle change by a first divisional target rotational angle within a range not exceeding a rotational limit (limitation value SA) for loss of synchronism of the stepper motor. The drive control device of the stepper motor drives the stepper motor by supplying to the stepper motor a second divisional target rotational angle which is a value calculated by the divisional target rotational angle computation process as a rotational angle per one control period.

Therefore, the drive shaft rotates by the divisional target rotational angle from the present rotational angle towards the target rotational angle at a constant rotational angle change so that rotation is conducted smoothly.

Besides, the divisional target rotational angle as the rotational angle per control period is a value not exceeding the rotation limit for loss of synchronism so that in comparison to a drive control device for a stepper motor that always rotates at the rotation limit for loss of synchronism, rotation frequencies at the rotation limit for loss of synchronism drastically decrease and performance to prevent loss of synchronism is improved.

Although the preferred embodiments of the present invention have been described, it should be understood that the present invention is not limited to these embodiments, and various modifications and changes can be made to the embodiments.

What is claimed is:

1. A stepper motor control device, comprising:
a sensor that detects physical quantities; and
a control device that controls an operation of a stepper motor based on data corresponding to the physical quantities sent from the sensor,
wherein the control device implements
a target rotational angle computation process that calculates a target rotational angle of a drive shaft of the stepper motor based on data corresponding to the physical quantities sent from the sensor,
a target rotational angle change computation process that calculates a target rotational angle change which is a difference between a present rotational angle of the drive shaft of the stepper motor and the target rotational angle, and
a divisional target rotational angle computation process that equally divides the target rotational angle change by a first divisional target rotational angle within a range not exceeding a rotational limit for loss of synchronism of the stepper motor;
wherein the control device is a drive control device of the stepper motor that drives the stepper motor by supplying to the stepper motor a second divisional target rotational angle which is a value calculated by the divisional target rotational angle computation process as a rotational angle per one control period;

wherein the divisional target rotational angle computation process divides the target rotational angle change by the first divisional target rotational angle within the range not exceeding the rotational limit for loss of synchronism of the stepper motor to calculate a "quotient" and a "remainder" thereof; and wherein the drive control device of the stepper motor sets the "quotient" to "quotient +1" in the case the "remainder" is not 0 and obtains a second divisional target rotational angle differing from the first divisional target rotational angle to drive the stepper motor based on the second divisional target rotational angle.

2. The stepper motor of claim 1, wherein the second divisional target rotational angle is a maximum value within the range in which the stepper motor does not lose synchronism.

3. The stepper motor of claim 1, wherein allocated quantities to the first divisional target rotational angle are uniform.

* * * * *